(12) United States Patent
Toda et al.

(10) Patent No.: US 6,394,733 B1
(45) Date of Patent: May 28, 2002

(54) SUBSTRATE BODY TRANSFER APPARATUS

(75) Inventors: Masayuki Toda, Yamagata-ken; Masaki Kusuhara, Tokyo; Masaru Umeda, Tokyo; Michio Yagai, Tokyo, all of (JP)

(73) Assignee: Kabushiki Kaisha Watanabe Shoko, Tokyo (JP)

( * ) Notice: Subject to any disclaimer, the term of this patent is extended or adjusted under 35 U.S.C. 154(b) by 0 days.

(21) Appl. No.: 09/719,032

(22) PCT Filed: Jun. 18, 1999

(86) PCT No.: PCT/JP99/03260

§ 371 (c)(1),
(2), (4) Date: Jan. 12, 2001

(87) PCT Pub. No.: WO99/66550

PCT Pub. Date: Dec. 23, 1999

(30) Foreign Application Priority Data

Jun. 19, 1998 (JP) ............................................. 10-173166

(51) Int. Cl.[7] .............................................. B65G 49/07
(52) U.S. Cl. .......................... 414/221; 406/73; 406/74; 406/192; 414/217; 414/935; 414/939
(58) Field of Search .......................... 406/73, 74, 192, 406/191, 198; 414/935, 939, 267, 266, 271, 221, 217

(56) References Cited

U.S. PATENT DOCUMENTS

| 5,820,329 A | * | 10/1998 | Derbinski et al. | ........... 414/225 |
| 6,000,905 A | * | 12/1999 | Toro-Lira | ................... 414/805 |
| 6,048,154 A | * | 4/2000 | Wytman | ...................... 414/217 |
| 6,059,507 A | * | 5/2000 | Adams | ...................... 414/217.1 |
| 6,152,669 A | * | 11/2000 | Morita et al. | ................ 414/217 |

FOREIGN PATENT DOCUMENTS

| JP | 53-106580 | 9/1978 | ........... H01L/21/68 |
| JP | 61-502363 | 10/1986 | ........... H01L/21/68 |
| JP | 63-225028 A | 9/1988 | ........... B65G/51/03 |
| JP | 08139155 A | 5/1996 | ........... H01L/21/68 |

OTHER PUBLICATIONS

Form PCT/IPEA/409 Cover Sheet and Box VIII (total of 3 sheets).

* cited by examiner

Primary Examiner—Christopher P. Ellis
Assistant Examiner—Joe Dillon, Jr.
(74) Attorney, Agent, or Firm—Randall J. Knuth

(57) ABSTRACT

A substrate body transfer apparatus which is capable of isolating the atmospheres of an external processing apparatus and an air conveyance apparatus and preventing the mutual contamination thereof, and which is capable of conducting the transfer of substrate bodies at a low level of particulate matter and contamination which satisfies the ultra-clean level. The substrate body transfer apparatus is provided with a vacuum container having an entrance and exit which communicate with the interior space of an air conveyance apparatus and the interior space of an external processing apparatus; a horizontal disc-shaped upper part valve and lower part valve are housed within the vacuum container and after the substrate body has been placed in a space surrounded by the upper and lower valves and this space has been sealed, the space is evacuated or the gas therein is replaced.

18 Claims, 2 Drawing Sheets

SUBSTRATE BODY TRANSFER APPARATUS

FIELD OF THE INVENTION

The present invention relates to a substrate body transfer apparatus. In greater detail, the present invention relates to a substrate body transfer apparatus which has the ability to move a substrate body employed in the semiconductor industry or liquid crystal industry between the inner space of an air conveyance apparatus and the inner space of an external processing apparatuses, without exposing the substrate body to the external atmosphere; this substrate body transfer apparatus is a so-called load-lock chamber or transfer chamber which is capable of isolating or replacing the atmosphere surrounding the substrate body.

DESCRIPTION OF THE RELATED ART

Conventionally, in manufacturing processes of semiconductors and the like, a substrate body conveyance apparatus is employed to move the substrate body (for example, a semiconductor wafer) between manufacturing apparatuses used in each process. Examples of this type of conveyance apparatus are, for example, conveyance apparatuses which convey a cassette jig, into which the substrate body is inserted, on a conveyance vehicle, and conveyance apparatuses which convey the substrate bodies one at a time using a robot arm. However, in these conveyance apparatuses, the atmosphere in the space in which the substrate body is processed is the atmospheric air, and it is currently the case that such spaces do not have an atmosphere of sufficiently high cleanliness. Recently, methods have also been employed in which a cassette jig with a substrate body inserted thereinto is conveyed in a sealed container; however, the problems of contamination from the materials of the container and the gasket used to maintain air tightness with respect to the substrate body have not been solved.

An air conveyance apparatus which conveys the substrate body using air (an air bearing) within the conveyance path has been proposed as a method for solving these problems. In these air conveyance apparatuses, the conveyance path can be made a closed type (closed system), so that it is possible to make the surroundings of the substrate body a space having a sufficiently high degree of atmospheric cleanliness. An example of the composition and function of an air conveyance apparatus is shown hereinbelow.

(1) The air conveyance apparatus is provided with a clean space tunnel therewithin, an opening part which forms the entrance and exit of the tunnel, and with an air conveyance surface.

(2) Lift pins which support the periphery of the substrate body and raises and lower it are provided at the air conveyance surface, and the substrate bodies are placed on the lift pins by a transfer hand (for example, the fingers of a robot or the like) of an external processing apparatus at the entrance of the tunnel.

(3) The lift pins are lowered, the substrate body is placed in an airstream comprising highly pure air, and is caused to float, and thereby, the substrate body is conveyed in the direction of the exit of the tunnel.

(4) At the exit of the tunnel, the substrate body, which has been conveyed in the air stream and is hovering at a position at which it is stopped, is lifted and supported by lift pins, and the substrate body is grasped and removed by a transfer hand of an external processing apparatus.

The air conveyance apparatus described above has the advantage that it is possible to convey the substrate body within the clean space tunnel and there are no parts which give rise to particulate matter within the apparatus; however, the following problems occur during transfer to or from other substrate body processing apparatuses at the entrance and the exit of the tunnel.

(1) The atmosphere of the external processing apparatus enters the air conveyance tunnel from the entrance and exit of the air conveyance apparatus, and the highly pure gas within the tunnel becomes contaminated.

(2) When the external processing apparatus is a vacuum apparatus or a reduced pressure apparatus, the highly pure gas within the air conveyance tunnel flows out, and enters into the external processing apparatuses, so that disruptions are caused to the air conveyance function and to the vacuum or reduced pressure functions.

In order to solve these problems, conventionally a so-called load-lock chamber is provided at the transfer part between apparatuses; in this chamber, a transfer hand (vacuum robot or the like) is installed within the chamber, which is placed between two isolating valves (gate valves or the like) which serve to separate the inner and outer atmospheres. However, such currently available products are incapable of sufficiently maintaining an ultra-clean level (a level in which the concentration of impurities is on the order of ppt), which allow almost no particulate matter or contamination, and furthermore, a load-lock chamber having the structure described above can not always be said to be the optimal structure for an air conveyance apparatus.

The present invention has as an object thereof to provide a substrate body transfer apparatus which isolates the atmospheres of external processing apparatuses and an air conveyance apparatus from one another and prevents mutual contamination, makes possible the transfer of substrate bodies at low levels of particulate matter and contamination which satisfy the ultra-clean level, and is optimal for use as a single wafer processing air conveyance apparatus.

SUMMARY OF THE INVENTION

The first substrate body transfer apparatus in accordance with the present invention is a substrate body transfer apparatus which has the ability to transfer substrate bodies between the interior space of an air conveyance apparatus and the interior space of external processing apparatuses without exposing the substrate bodies to the external atmosphere, wherein the transfer apparatus is provided with: a vacuum container, the internal pressure of which can be reduced; a partition which horizontally divides the interior of the vacuum container into two chambers, an upper space and a lower space; an opening which is provided in the upper space and which communicates with the interior space of an external processing apparatus; an opening which is provided in the lower space and which communicates with the interior space of the air conveyance apparatus; a circular opening which is provided in the center of the partition; valve seats which are provided in both the upper and lower surfaces along the periphery of this opening; a horizontal disc-shaped upper part valve, which is positioned within the upper space, and may be raised and lowered; a horizontal disc-shaped lower part valve, which is positioned within the lower space, on which the substrate body is positioned, and which may be raised and lowered; a means for raising and lowering the entirety of the upper part valve; and a means for raising and lowering the entirety of the lower part valve.

The second substrate body transfer apparatus in accordance with the present invention is a substrate body transfer apparatus which has the ability to transfer substrate bodies between the interior space of an air conveyance apparatus and the interior space of external processing apparatuses without exposing the substrate bodies to the external atmosphere, wherein the transfer apparatus is provided with: a vacuum container, the internal pressure of which can be reduced; a partition which horizontally divides the interior of the vacuum container into two chambers, an upper space and a lower space; an opening which is provided in the upper space and which communicates with the interior space of the air conveyance apparatus; an opening which is provided in the lower space and which communicates with the interior space of an external processing apparatus; a circular opening which is provided in the center of the partition; valve seats which are provided in both the upper and lower surfaces along the periphery of this opening; a horizontal disc-shaped upper part valve, which is positioned within the upper space, and may be raised and lowered; a horizontal disc-shaped lower part valve, which is positioned within the lower space, on which the substrate body is positioned, and which may be raised and lowered; a means for raising and lowering the entirety of the upper part valve; and a means for raising and lowering the entirety of the lower part valve.

Both the substrate body transfer apparatuses having the composition described above have a vacuum container provided with an entrance and an exit which communicate with the interior space of the air conveyance apparatus and the interior space of an external processing apparatus, and a horizontal disc-shaped upper part valve and lower part valve are housed within the vacuum container, so that after the substrate body has been positioned within a space surrounded by the upper and lower valves and this space has been sealed, it is possible to render this space a vacuum or to replace the air within. Accordingly, a substrate body transfer apparatus is obtained which is capable of isolating the atmospheres of the external processing apparatus and the air conveyance apparatus from one another and preventing mutual contamination, and which is capable of conducting transfer of the substrate body with a low level of particulate matter or contaminants.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
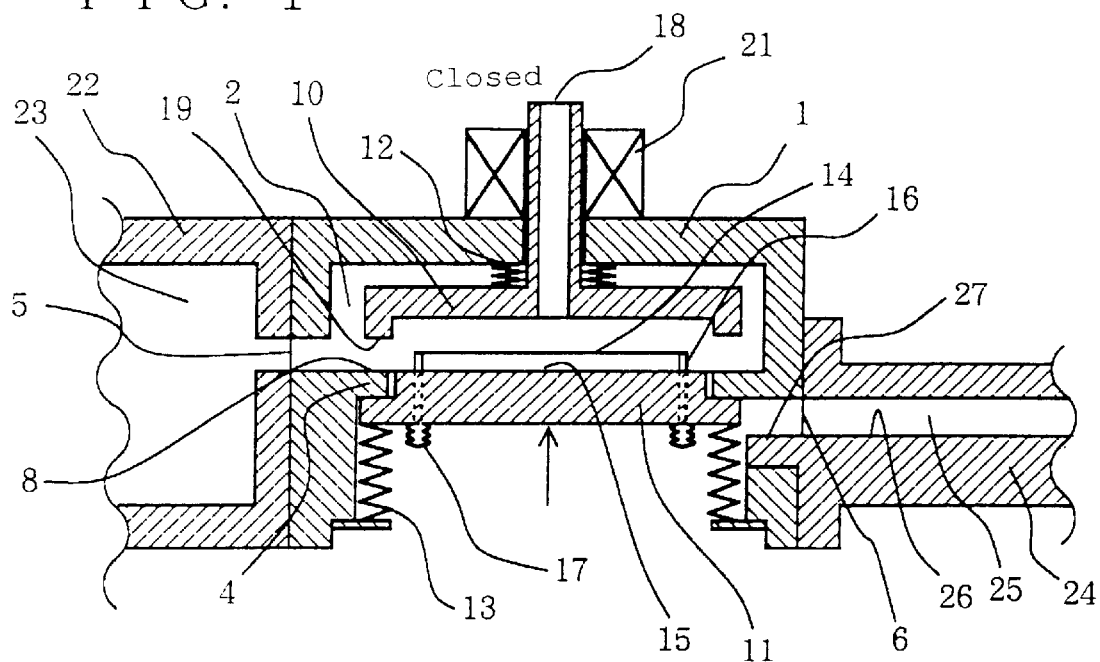
FIG. 1 is a type cross-sectional view showing a first substrate body transfer apparatus in accordance with the present invention; the state shown is one in which the upper space and lower space of the transfer apparatus are isolated from one another by the lower valve, and a substrate body is transferred from the external processing apparatus to the upper space of the transfer apparatus.

Description of the References.
1 vacuum container forming the transfer apparatus,
2 upper space within the vacuum container,
3 lower space within the vacuum container,
4 partition horizontally separating the interior of the vacuum container into two chambers, an upper space and a lower space,
5 opening provided in the upper space communicating with the interior space of an external processing apparatus,
6 opening provided in the lower space communicating with the lower space of the air conveyance apparatus,
7 circular opening provided in the center of the partition,
8 valve seat provided in the upper surface along the periphery of the opening,
9 valve seat provided in the lower surface along the periphery of the opening,
10 horizontal disc-shaped upper part valve disposed within the upper space which may be raised and lowered,
11 horizontal disc-shaped lower part valve disposed within the lower space on which a substrate body is placed and which may raised and lowered,
12 mechanism for raising and lowering the entirety of the upper part valve,
13 mechanism for raising and lowering the entirety of the lower part valve,
14 substrate body,
15 conveyance surface of the lower part valve which opposes the rear surface of the substrate body,
16, 17 mechanisms capable of raising and lowering the substrate body provided at the conveyance surface of the lower part valve which opposes the rear surface of the substrate body,
18 gas inlet port of the upper part valve,
19 part of the upper part valve which makes contact with the valve seat,
20 part of the lower part valve which makes contact with the valve seat,
21 coil,
22 external processing apparatus,
23 interior space of the external processing apparatus,
24 air conveyance apparatus,
25 interior space of the air conveyance apparatus,
26 conveyance surface of the air conveyance apparatus,
27 end of the conveyance surface of the air conveyance apparatus,
101 vacuum container forming the transfer apparatus,
102 upper space within the vacuum container,
103 lower space within the vacuum container,
104 partition horizontally separating the interior of the vacuum container into two chambers, an upper space and a lower space,
105 opening provided in the upper space communicating with the interior space of the air conveyance apparatus,
106 opening provided in the lower space communicating with the interior space of an external processing apparatus, 107 circular opening provided in the center of the partition,
108 valve seat provided in the upper surface along the periphery of the opening,
109 valve seat provided in the lower surface along the periphery of the opening,
110 horizontal disc-shaped upper part valve disposed within the upper space which may be raised and lowered,
111 horizontal disc-shaped lower part valve disposed within the lower space on which a substrate body is placed and which may raised and lowered,
112 mechanism for raising and lowering the entirety of the upper part valve,
113 mechanism for raising and lowering the entirety of the lower part valve,
114 substrate body,
115 conveyance surface of the lower part valve which opposes the rear surface of the substrate body,
116, 117 mechanisms capable of raising and lowering the substrate body provided at the conveyance surface of the lower part valve which opposes the rear surface of the substrate body,
118 gas inlet port of the upper part valve,
119 part of the upper part valve which makes contact with the valve seat,
120 part of the lower part valve which makes contact with the valve seat,
121 coil,
122 external processing apparatus,
123 interior space of the external processing apparatus,
124 air conveyance apparatus,
125 interior space of the air conveyance apparatus,
126 conveyance surface of the air conveyance apparatus,
127 end of the conveyance surface of the air conveyance apparatus. Best Mode for Carrying Out the Invention Hereinbelow, an embodiment of the present invention will be explained together with the function of the present invention and the like.

First Embodiment.

Figure 2:
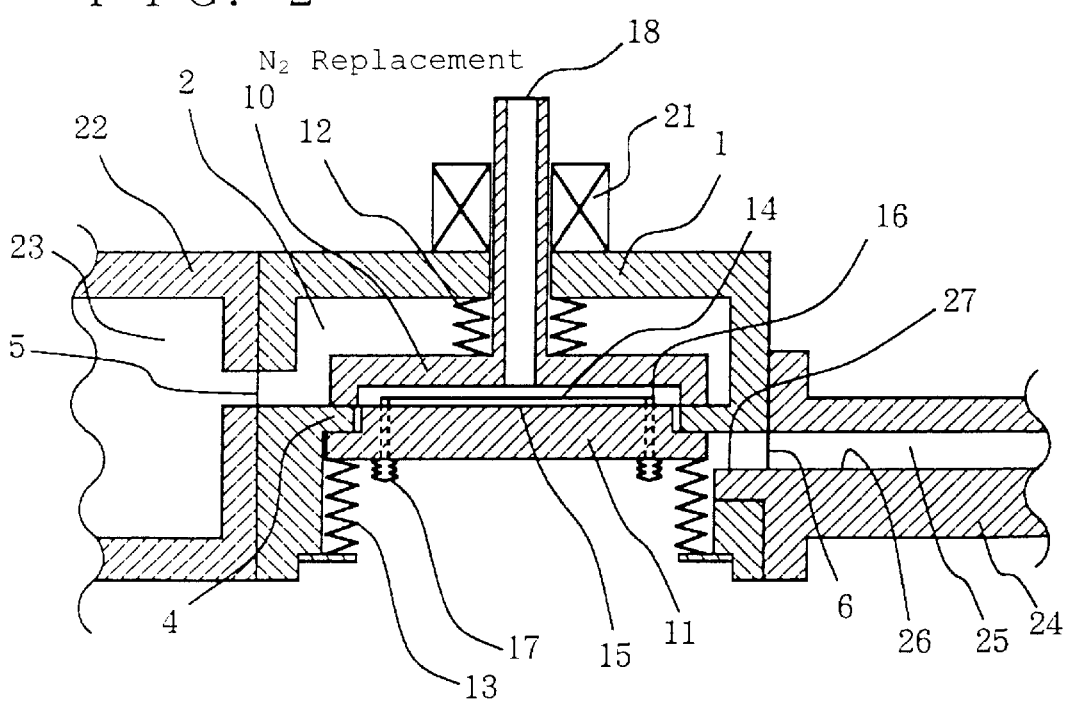
FIG. 2 is a type cross-sectional view showing a first substrate body transfer apparatus in accordance with the present invention; the state shown is one in which the substrate body is sealed in the transfer apparatus by being surrounded by the upper part valve and the lower part valve.
Figure 3:
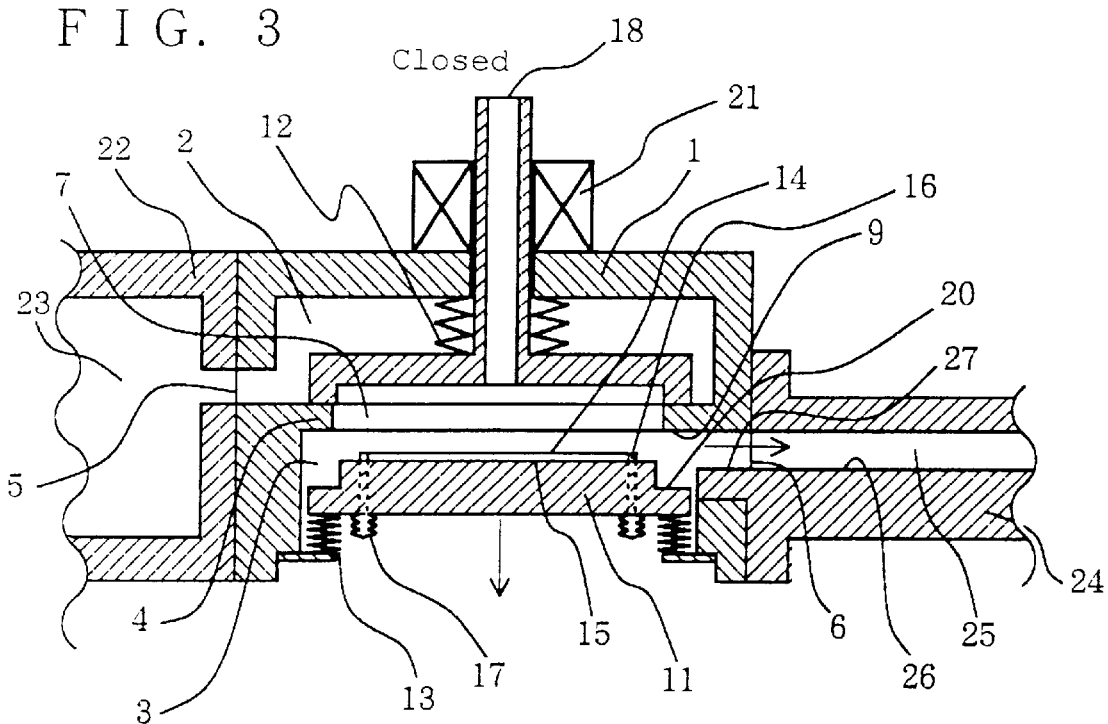
FIG. 3 is a type cross-sectional view showing a first substrate body transfer apparatus in accordance with the present invention; the state shown is one in which the upper space and the lower space of the transfer apparatus are isolated from one anther by the upper part valve, and a substrate body is placed on the conveyance surface of the lower part valve.

FIGS. 1 through 3 are type cross-sectional views showing the first substrate body transfer apparatus in accordance with the present invention. The first substrate body transfer apparatus has a structure such that the opening provided in the upper space communicates with the interior space of an external processing apparatus, while the opening provided in the lower space communicates with the interior space of the air conveyance apparatus. FIG. 1 shows a state in which the upper space and the lower space of the transfer apparatus are isolated from one another by the lower part valve, and a substrate body is moved into the upper space of the transfer apparatus from the external processing apparatus, FIG. 2 shows a state in which the substrate body is sealed within the transfer apparatus by being surrounded by the upper part valve and the lower part valve, and FIG. 3 shows a state in which the upper space and the lower space of the transfer apparatus are isolated from one another by the upper part valve, and the substrate body is positioned on the conveyance surface of the lower part valve.

In FIGS. 1 through 3, 1 indicates a vacuum container comprising the transfer apparatus, 2 indicates the upper space within the vacuum container, 3 indicates the lower space within the vacuum container, 4 indicates a partition horizontally separating the interior of the vacuum container into two chambers, an upper space and a lower space, 5 indicates an opening provided in the upper space communicating with the interior space of an external processing apparatus, 6 indicates an opening provided in the lower space communicating with the interior space of the air conveyance apparatus, 7 indicates a circular opening provided in the center of the partition, 8 indicates a valve seat provided in the upper surface along the periphery of the opening, 9 indicates a valve seat provided in the lower surface along the periphery of the opening, 10 indicates a horizontal disc-shaped upper part valve disposed within the upper space which may be raised and lowered, 11 indicates a horizontal disc-shaped lower part valve disposed within the lower space on which a substrate body is placed and which may raised and lowered, 12 indicates a mechanism for raising and lowering the entirety of the upper part valve, 13 indicates a mechanism for raising and lowering the entirety of the lower part valve, 14 indicates a substrate body, 15 indicates a conveyance surface of the lower part valve which opposes the rear surface of the substrate body, 16 and 17 indicate mechanisms capable of raising and lowering the substrate body provided at the conveyance surface of the lower part valve which opposes the rear surface of the substrate body, 18 indicates a gas inlet port of the upper part valve, 19 indicates the part of the upper part valve which makes contact with the valve seat, 20 indicates the part of the upper part valve which makes contact with the valve seat, 21 indicates a coil, 22 indicates an external processing apparatus, 23 indicates an interior space of the external processing apparatus, 24 indicates the air conveyance apparatus, 25 indicates the interior space of the air conveyance apparatus, 26 indicates the conveyance surface of the air conveyance apparatus, and 27 indicates the end of the conveyance surface of the air conveyance apparatus.

As shown in FIGS. 1 through 3, the interior of the vacuum chamber comprising the substrate body transfer apparatus is provided with two upper and lower spaces 2 and 3, and horizontal partition 4 is placed centrally between the upper space 2 and the lower space 3, and a circular opening 7 is provided in the center part of the partition. The upper surface 8 and the lower surface 9 of the periphery of the circular opening 7 form valve seats. A horizontal disc-shaped upper part valve 10 is housed in the upper space 2, and this upper part valve 10 may be raised and lowered by a mechanism 12 for raising and lowering the entirety of the upper part valve. When the upper part valve 10 is lowered, the contacting part 19 in the upper part valve which makes contact with the valve seat comes into tight contact with the upper surface valve seat 8, and the upper space 2 of the vacuum container 1 is isolated from the lower space 3.

On the other hand, the substrate body 14 is placed on a horizontal disc-shaped lower part valve 11 which may be raised and lowered is housed within the lower space 3. By raising and lowering the lower part valve 11 using a mechanism 13 for raising and lowering the entirety of the lower part valve, this may be brought into the vicinity of the end 27 of the conveyance surface 26 of the air conveyance apparatus 24. When the lower part valve 11 is raised, the contact part 20 in the lower part valve which makes contact with the valve seat comes into tight contact with the lower surface valve seat 9 of the partition opening 7 and the lower space 3 of the vacuum container 1 is isolated from the upper space 2. Here, the mechanism 12 for raising and lowing the entirety of the upper part valve and the mechanism 13 for raising and lowering the entirety of the lower part valve may be operated independently. Furthermore, mechanisms 16 and 17, which are capable, independently of the mechanism 13 which raises and lowers the entirety of the lower part valve, of raising and lowering the substrate body 14 on the conveyance surface 15 of the lower part valve 11, which opposes the rear surface of the substrate body, are provided. For example, lift pins may be employed as mechanism 16, while a bellows may be employed as mechanism 17. Furthermore, the conveyance surface 15 of the lower part valve 11 which opposes the rear surface of the substrate body has a structure which is provided with gas nozzles which have the function of conducting the floating or grounding of the substrate body 14, the catching or launching of the substrate body, the centering of the substrate body, or the horizontal rotation or horizontal stoppage of the substrate body, as well as with a mechanism (not depicted in the figure) for supplying gas to the nozzles at a predetermined timing, flow rate, and pressure.

Hereinbelow, the operation of the transfer apparatus in the case in which a substrate body is transferred from an external processing apparatus 22 to the air conveyance apparatus 24 will be explained in detail using FIGS. 1 through 3.

In FIG. 1, the lower part valve 11 is raised (the direction indicated by the arrow) and in the state in which the contact part 20 in the lower part valve which makes contact with the valve seat is in tight contact with the lower surface valve seat 9 of the partition opening 7, the upper space 2 of the vacuum container 1 is isolated from the lower space 3. In this state, within the upper space 2, a transfer hand (not depicted in the figure) of the external processing apparatus 22 places the substrate body 14 on the lift pins 16 via the opening 5 which communicates with the interior space 23 of the external processing apparatus 22, and then the hand is withdrawn to the outside, and thereby, the substrate body 14 is transferred from the interior space 23 of the external processing apparatus 22 to the upper space 2 of the vacuum container 1.

After this, lift pins 16 are lowered, the upper part valve 10 is lowered and the contact part 19 of the upper part valve which makes contact with the valve seat is in tight contact with the upper surface valve seat 8 of the partition opening 7 (FIG. 2). As a result, the substrate body 14 is sealed between the upper part valve 10 and the conveyance surface 15 of the lower part valve 11. Next, the sealed space bounded by the upper part valve 10 and lower part valve 11 is evacuated via a gas inflow port 18 of the upper part valve 10, and then the interior of the sealed space is filled with $N_2$ gas and set to atmospheric pressure.

As shown in FIG. 3, the lower part valve 11 is lowered (the direction shown by the arrow) until the conveyance surface 15 is at the same height as the end 27 of the air conveyance surface. Next, a spray of flotation $N_2$ gas is initiated toward the substrate body 14 from a gas nozzle (not depicted in the figure) provided in the conveyance surface 15 of the lower part valve 11. Next, the lift pins 16 are lowered to a height below that of the conveyance surface 15, and thereby, the substrate body 14 is caused to float and is placed in a hovering state. After this, a spray of floating $N_2$ gas is initiated at the end 27 of the conveyance surface 26 of the air conveyance apparatus 24, and furthermore, substrate body-launching $N_2$ gas is jetted at the conveyance surface 15 of lower part valve 11, and thereby, the substrate body 14 is conveyed into the interior space 25 of the air conveyance apparatus 24. By means of the operations described above, the movement of the substrate body from the external processing apparatus 22 to the air conveyance apparatus 24 is completed.

In contrast, the operations of the transfer apparatus when the substrate body 14 is moved from the air conveyance apparatus 24 to the external processing apparatus 22 may basically be accomplished by reversing the operations described above. That is it say, using a floatation $N_2$ gas spray at the conveyance surface 26 of the air conveyance apparatus 24 and the conveyance surface 15 of the lower part valve 11, the substrate body 14 is transferred from the interior space of the air conveyance apparatus 24 to within the lower space 3 of the transfer apparatus, and then, by stopping the spray of flotation gas, the substrate body 14 is placed on the lift pins 16. Next, the conveyance surface 15 of the lower part valve 11 is raised, and the substrate body 14 is sealed between the upper part valve 10 and the conveyance surface 15 of the lower part valve 11. After this, the interior of the sealed space enclosed by the upper part valve 10 and the lower part valve 11 may be evacuated via the gas inlet port 18 of the upper part valve 10, or alternatively, this space may be filled with the same gas as that of the external processing apparatus 22, which is the destination to which the substrate body 14 is subsequently to be moved. Next, the upper part valve 10 is raised, the upper space 2 is placed in communication with the interior space 23 of the external processing apparatus 22, and a transfer hand (not depicted in the figure) of the external processing apparatus 22 removes the substrate body 14, and thus the movement of the substrate body 14 is completed.

Second Embodiment.

Figure 4:
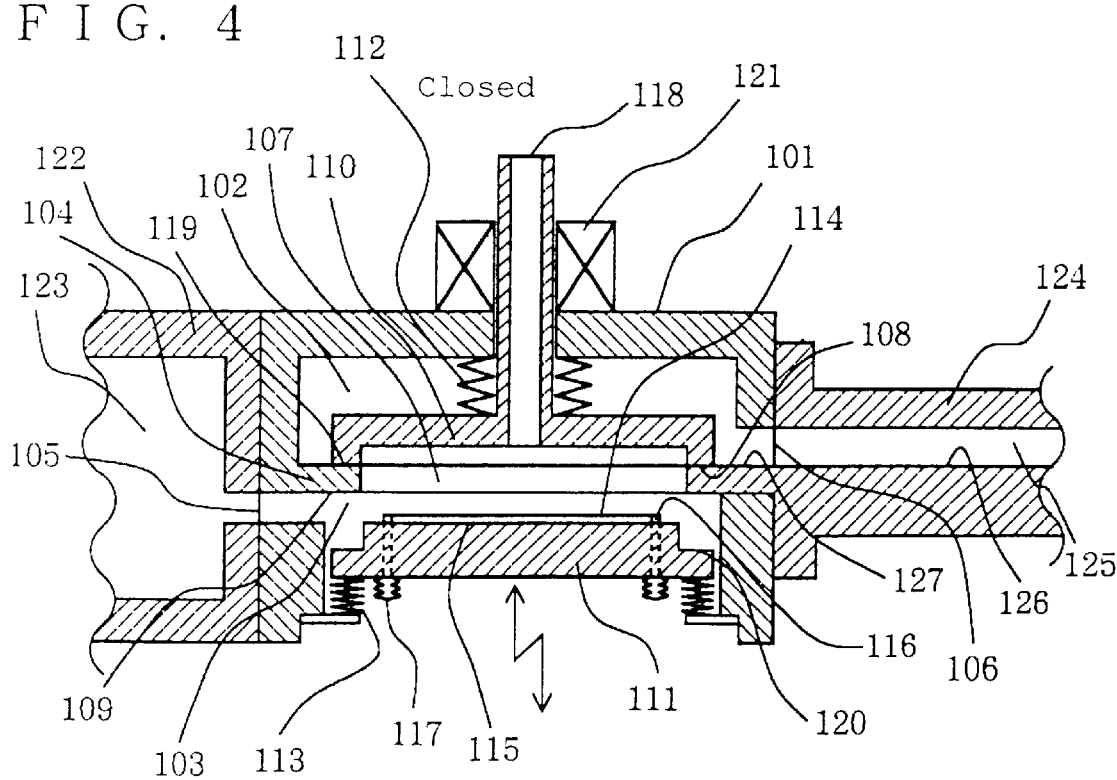
FIG. 4 is a type cross-sectional view showing a second substrate body transfer apparatus in accordance with the present invention.

FIG. 4 is a type cross-sectional view showing a second substrate body transfer apparatus in accordance with the present invention. The second substrate body transfer apparatus differs from the first substrate body transfer apparatus shown in the first embodiment in that the opening provided in the upper space communicates with the interior space of the air conveyance apparatus, while the opening provided in the lower space communicates with the interior space of the external processing apparatus. Other points are identical to those in the first substrate body transfer apparatus.

In FIG. 4, 101 indicates a vacuum container comprising the transfer apparatus, 102 indicates the upper space within the vacuum container, 103 indicates the lower space within the vacuum container, 104 indicates a partition horizontally separating the interior of the vacuum container into two chambers, an upper space and a lower space, 105 indicates an opening provided in the upper space communicating with the interior space of the air conveyance apparatus, 106 indicates an opening provided in the lower space communicating with the interior space of an external processing apparatus, 107 indicates a circular opening provided in the center of the partition, 108 indicates a valve seat provided in the upper surface along the periphery of the opening, 109 indicates a valve seat provided in the lower surface along the periphery of the opening, 110 indicates a horizontal disc-shaped upper part valve disposed within the upper space which may be raised and lowered, 111 indicates a horizontal disc-shaped lower part valve disposed within the lower space on which a substrate body is placed and which may raised and lowered, 112 indicates a mechanism for raising and lowering the entirety of the upper part valve, 113 indicates a mechanism for raising and lowering the entirety of the lower part valve, 114 indicates a substrate body, 115 indicates a conveyance surface of the lower part valve which opposes the rear surface of the substrate body, 116 and 117 indicate mechanisms capable of raising and lowering the substrate body provided at the conveyance surface of the lower part valve which opposes the rear surface of the substrate body, 118 indicates a gas inlet port of the upper part valve, 119 indicates the part of the upper part valve which makes contact with the valve seat, 120 indicates the part of the upper part valve which makes contact with the valve seat, 121 indicates a coil, 122 indicates an external processing apparatus, 123 indicates an interior space of the external processing apparatus, 124 indicates the air conveyance apparatus, 125 indicates the interior space of the air conveyance apparatus, 126 indicates the conveyance surface of the air conveyance apparatus, and 127 indicates the end of the conveyance surface of the air conveyance apparatus.

Hereinbelow, the operation of the transfer apparatus in the case in which a substrate body is moved from the external processing apparatus 22 to the air conveyance apparatus 24 will be explained in detail using FIG. 4.

First, at an opening 106 which communicates with the interior space 123 of the external processing apparatus 122, which opening is provided in the lower space 103 of the transfer apparatus, a transfer hand (not depicted in the figure) of the external processing apparatus 122 is inserted into the lower space 103, and the substrate body 114 is placed on the lift pins 116 provided at the conveyance surface 115 of the lower part valve 111, which is at a lower position than the end 127 of the air conveyance apparatus 124. After this, the transfer hand (not depicted in the figure) is withdrawn to the interior space 123 of the processing apparatus 122 from the lower space 103.

Next, the conveyance surface 15 of the lower part valve 111 is raised to the same height as the conveyance surface 126 of the air conveyance apparatus 124, comes into tight contact with the partition lower surface seat 109, and this isolates the lower space 103 from the upper space 102, and the substrate body 114 is sealed in the space between this and the upper part valve 110. Next, the interior of the sealed space surrounded by the upper part valve 110 and the lower part valve 111 is evacuated through a gas inflow port 118 in the upper part valve 110, and then, the interior of the sealed space is filled with $N_2$ gas at atmospheric pressure.

After this, the upper part valve 110 is raised, and a spray of floatation $N_2$ gas is initiated at the conveyance surface 115 of the lower part valve 111. Next, the lift pins 116 are lowered to a height lower than that of the conveyance surface 115, and thereby, the substrate body 114 is caused to float and is in a hovering state. Next, a spray of flotation $N_2$ gas is initiated at the end 127 of the conveyance surface 126 of the air conveyance apparatus 124, as well, and furthermore, substrate body-launching $N_2$ gas is jetted at the conveyance surface 115 of the lower part valve 111, and thereby, the substrate body 114 is conveyed within the interior space 125 of the air conveyance apparatus 124. By means of the operations described above, the transfer of the substrate body from the external processing apparatus 122 to the air conveyance apparatus 124 is completed.

In contrast, the operations of the transfer apparatus when the substrate body 114 is transferred from the gas conveyance apparatus 124 to the external processing apparatus 122 may basically be accomplished by reversing the operations described. That is to say, the after substrate body 114 has been supported on the lift pins 116, the upper part valve 110 is lowered and the substrate body 114 is sealed, and the upper space 102 is isolated from the lower space 103. After this, the interior of the sealed space is either evacuated or filled with the same gas as that of the external processing apparatus 122, via the gas input port 118 in the upper part valve 110. Next, the lower part valve 111 is lowered, and the lower space 103 is made to communicate with the interior space 123 of the external processing apparatus 122, and the transfer hand (not depicted in the figure) of the external processing apparatus 122 removes substrate body 114, and the transfer of the substrate body 114 is completed.

As described above, in contrast to the first substrate body transfer apparatus shown in the first embodiment, which conducts transfer of the substrate body with the external processing apparatus 22 at a position which is higher than the substrate body conveyance level of the air conveyance apparatus 24, the second substrate body transfer apparatus shown in the second embodiment conducts transfer of the substrate body with the external processing apparatus 122 at a position which is lower than the substrate body conveyance level of the air conveyance apparatus 124. By appropriately employing the two types of substrate body transfer apparatus described above, it is possible to achieve a great degree of freedom in the adjustment of the transfer height of the substrate body with the external processing apparatus.

In the embodiment described above, the material used to comprise the peripheral parts of the circular opening provided in the center of the partition may be ceramics, such as, for example, silicon carbide (SiC), boron nitride (BN), aluminum nitride (AlN), highly pure alumina ($Al_2O_3$), and the like, as well as such materials which are coated on the surface thereon with a diamond thin film, or may be selected from ultra pure quartz or super hard metals, and by employing materials which are vacuum-tight and which do not contaminate conveyed products, it can be confirmed that the particle count and the degree of contamination in the interior space of the transfer apparatus are at the ultra-clean level (that is to say, an impurity concentration on the order of ppt). However, when a certain particle count or degree of contamination can be tolerated in the air conveyance apparatus, gaskets comprising polymers or synthetic resins or the like may be employed as the seal parts of the valve seats and the valves, and it is of course the case that these may be applied to the structure of the present embodiment.

Furthermore, in the embodiment described above, when the upper part valve and the lower part valve are brought into tight contact with the valve seats, the speed of progress of the upper part valve and the lower part valve is kept at $5 \times 10^{-3}$ m/sec or less from a distance just before contact to tight contact, and thereby, it is possible to maintain the generation of the particles in the interior space of the transfer apparatus at the ultra-clean level.

Furthermore, in the embodiment described above, the lower part valve is provided with gas nozzles having the function of conducting the flotation or grounding of the substrate body, the catching or launching of the substrate body, the centering of the substrate body, or the horizontal rotation or horizontal stoppage of the substrate body, as well as with a mechanism for supplying gas to these nozzles at a predetermined timing, flow rate, and pressure, and thereby, it is possible to conduct the fine control of the substrate body when transferring the substrate body while it is floating.

In this case, it is preferable that the nozzles provided with the function of conducting flotation or grounding of the substrate body be bored at an angle of 22° with respect to the conveyance surface of the lower part valve, and that the horizontal force component of the stream of gas sprayed from the nozzles be such as to be divided into four quadrants or three quadrants pointing to the center of the upper part valve. Furthermore, it is desirable that the nozzles provided with the function of conducting the catching or launching of the substrate body be bored at angle of 22° with respect to the conveyance surface of the lower part valve, and that the horizontal force component of the gas stream sprayed from these nozzles be such as to be disposed so as to be parallel with the air conveyance path communicating with the interior space of the air conveyance apparatus. Furthermore, by providing the nozzles provided with the function of conducting the horizontal rotation or horizontal stoppage of the substrate body with the function of determining the direction of the axis of crystallization of the substrate body and placing the substrate body on a mechanism for raising and lowing the substrate body which is provided at the conveyance surface of the lower part valve, it is possible to reliably support the substrate body on the lower part valve even when the lower part valve is raised or lowered or the surroundings of the substrate body become depressurized or pressurized.

Industrial Applicability.

As described above, in accordance with the present invention, a substrate body transfer apparatus is obtained which is capable, when transferring substrate bodies between a single wafer processing type air conveyance apparatus and another external processing apparatus, of presenting no obstacle to the mutual function, and is capable of replacing the atmosphere in In the embodiment described above, the material used to comprise the peripheral parts of the circular opening provided in the center of the partition may be ceramics, such as, for example, silicon carbide (SiC), boron nitride (BN), aluminum nitride (AlN), highly pure alumina ($Al_2O_3$), and the like, as well as such materials which are coated on the surface thereon with a diamond thin film, or may be selected from ultra pure quartz or super hard metals, and by employing materials which are vacuum-tight and which do not contaminate conveyed products, it can be confirmed that the particle count and the degree of contamination in the interior space of the transfer apparatus are at the ultra-clean level (that is to say, an impurity concentration on the order of ppt). However, when a certain particle count or degree of contamination can be tolerated in the air conveyance apparatus, gaskets comprising polymers or synthetic resins or the like may be employed as the seal parts of the valve seats and the valves, and it is of course the case that these may be applied to the structure of the present embodiment.

Furthermore, in the embodiment described above, when the upper part valve and the lower part valve are brought into tight contact with the valve seats, the speed of progress of the upper part valve and the lower part valve is kept at $5\times10^{-3}$ m/sec or less from a distance just before contact to tight contact, and thereby, it is possible to maintain the generation of the particles in the interior space of the transfer apparatus at the ultra-clean level.

Furthermore, in the embodiment described above, the lower part valve is provided with gas nozzles having the function of conducting the flotation or grounding of the substrate body, the catching or launching of the substrate body, the centering of the substrate body, or the horizontal rotation or horizontal stoppage of the substrate body, as well as with a mechanism for supplying gas to these nozzles at a predetermined timing, flow rate, and pressure, and thereby, it is possible to conduct the fine control of the substrate body when transferring the substrate body while it is floating.

In this case, it is preferable that the nozzles provided with the function of conducting flotation or grounding of the substrate body be bored at an angle of 22° with respect to the conveyance surface of the lower part valve, and that the horizontal force component of the stream of gas sprayed from the nozzles be such as to be divided into four quadrants or three quadrants pointing to the center of the upper part valve. Furthermore, it is desirable that the nozzles provided with the function of conducting the catching or launching of the substrate body be bored at angle of 22° with respect to the conveyance surface of the lower part valve, and that the horizontal force component of the gas stream sprayed from these nozzles be such as to be disposed so as to be parallel with the air conveyance path communicating with the interior space of the air conveyance apparatus. Furthermore, by providing the nozzles provided with the function of conducting the horizontal rotation or horizontal stoppage of the substrate body with the function of determining the direction of the axis of crystallization of the substrate body and placing the substrate body on a mechanism for raising and lowing the substrate body which is provided at the conveyance surface of the lower part valve, it is possible to reliably support the substrate body on the lower part valve even when the lower part valve is raised or lowered or the surroundings of the substrate body become depressurized or pressurized.

Industrial Applicability

As described above, in accordance with the present invention, a substrate body transfer apparatus is obtained which is capable, when transferring substrate bodies between a single wafer processing type air conveyance apparatus and another external processing apparatus, of presenting no obstacle to the mutual function, and is capable of replacing the atmosphere in the vicinity of the substrate body. For this reason, the substrate body transfer apparatus of the present invention is easily capable of linking an air conveyance apparatus and an external processing apparatus without causing a change in the internal atmospheres of the air conveyance apparatus and the external processing apparatus. Furthermore, the substrate body transfer apparatus in accordance with the present invention employs materials having an ultra high degree of hardness, which are unlikely to undergo plastic deformation, for the internal valves and valve seats, and the internal valves and valve seats have a simple planar contact structure, and by maintaining the progress rate thereof from a position just before contact to tight contact at a level of $5\times10^{-3}$ m/sec or less, a seal is formed which gives rise to almost no particulate matter, so that it is possible to conduct operations at an ultra-clean level.

What is claimed is:

1. A substrate body transfer apparatus which has the ability to transfer substrate bodies between an interior space of an air conveyance apparatus and an interior space of an external processing apparatus without exposing the substrate bodies to the external atmosphere, said transfer apparatus comprises:

a vacuum container, the internal pressure of which can be reduced;

a partition which divides the interior of said vacuum container into two chambers, that is an upper space chamber and a lower space chamber;

said upper space chamber having an opening which communicates with the interior space of said external processing apparatus;

said lower space chamber having an opening which communicates with the interior space of said air conveyance apparatus;

a circular opening which is provided in the center of said partition;

valve seats which are provided in both the upper and lower surfaces along the periphery of said circular opening;

a horizontal disc-shaped upper part valve, which is positioned within said upper space chamber, and may be raised and lowered;

a horizontal disc-shaped lower part valve, which is positioned within said lower space chamber, on which a substrate body is positioned, and which may be raised and lowered;

a means for raising and lowering the entirety of said upper part valve; and a means for raising and lowering the entirety of said lower part valve.

2. A substrate body transfer apparatus in accordance with claim 1, in which a conveyance surface of said lower part valve which opposes a rear surface of the substrate body is provided with a means for raising and lowering said substrate body.

3. A substrate body transfer apparatus in accordance with claim 1, in which the material comprising the peripheral part of said circular opening and said valve seats is a material selected from a group containing ceramics, diamond thin film coated ceramics, and ultra hard alloys.

4. A substrate body transfer apparatus in accordance with claim 3, in which a ceramic is one of silicon carbide (SiC), boron nitride (BN), aluminum nitride (AlN), and alumina ($Al_2O_3$).

5. A substrate body transfer apparatus in accordance with claim 1, in which when said upper part valve and said lower part valve are brought into tight contact with said valve seats, the rate of progress of said upper part valve and said lower part valve is $5\times10^{-3}$ m/sec or less from a distance just before contact to tight contact.

6. A substrate body transfer apparatus in accordance with claim 1, in which said upper part valve is provided with,
   at a conveyance surface opposed to the rear surface of the substrate body, gas nozzles provided with the function of conducting flotation and grounding of the substrate body, catching and launch of the substrate body, centering of the substrate body, or horizontal rotation or horizontal stoppage of the substrate body, and
   a means for supplying gas to said nozzles at predetermined timing, flow rate, and pressure.

7. A substrate body transfer apparatus in accordance with claim 6, in which the nozzles provided with the function of conducting floatation and grounding of said substrate body are bored at an angle of 22° with respect to the conveyance surface of said lower part valve, and the horizontal force component of the gas stream sprayed from said nozzles is such as to be divided into one of four quadrants or three quadrants pointing to the center of said lower part valve.

8. A substrate body transfer apparatus in accordance with claim 6, in which the nozzles provided with the function of conducting the catching and launch of said substrate body are bored at an angle of 22° with respect to the conveyance surface of said lower part valve, and the horizontal force component of the gas stream sprayed from these nozzles is arranged so as to be substantially parallel to the air conveyance path which communicates with the interior space of said air conveyance apparatus.

9. A substrate body transfer apparatus in accordance with claim 6, in which the nozzles provided with the function of conducting horizontal rotation or horizontal stoppage of said substrate body have the function of determining the direction of the axis of crystallization of said substrate body and placing said substrate body on a means for raising and lowering said substrate body provided at the conveyance surface of said lower part valve.

10. A substrate body transfer apparatus which has the ability to transfer substrate bodies between an interior space of an air conveyance apparatus and an interior space of an external processing apparatus without exposing the substrate bodies to the external atmosphere, said transfer apparatus comprises:
   a vacuum container, the internal pressure of which can be reduced;
   a partition which horizontally divides the interior of said vacuum container into two chambers, that is an upper space chamber and a lower space chamber;
   said upper space chamber having an opening which communicates with the interior space of said air conveyance apparatus;
   said lower space chamber having an opening which communicates with the interior space of said external processing apparatus;
   a circular opening which is provided in the center of said partition;
   valve seats which are provided in both the upper and lower surfaces along the periphery of said circular opening;
   a horizontal disc-shaped upper part valve, which is positioned within a upper space chamber, and may be raised and lowered;
   a horizontal disc-shaped lower part valve, which is positioned within said lower space chamber, on which said substrate body is positioned, and which may be raised and lowered;
   a means for raising and lowering the entirety of said upper part valve; and
   a means for raising and lowering the entirety of said lower part valve.

11. A substrate body transfer apparatus in accordance with claim 10, in which a conveyance surface of said lower part valve which opposes the rear surface of the substrate body is provided with a means for raising and lowering said substrate body.

12. A substrate body transfer apparatus in accordance with claim 10, in which when said upper part valve and said lower part valve are brought into tight contact with said valve seats, the rate of progress of said upper part valve and said lower part valve is $5\times10^{-3}$ m/sec or less from a distance just before contact to tight contact.

13. A substrate body transfer apparatus in accordance with claim 10, in which the material comprising the peripheral part of said circular opening and said valve seats is a material selected from a group containing ceramics, diamond thin film coated ceramics, and ultra hard alloys.

14. A substrate body transfer apparatus in accordance with claim 13, in which a ceramic is one of silicon carbide (SiC), boron nitride (BN), aluminum nitride (AlN), and alumina ($Al_2O_3$).

15. A substrate body transfer apparatus in accordance with claim 10, in which said upper part valve is provided with,
   at a conveyance surface opposed to the rear surface of the substrate body, gas nozzles provided with the function of conducting flotation and grounding of the substrate body, catching and launch of the substrate body, centering of the substrate body, or horizontal rotation or horizontal stoppage of the substrate body, and
   a means for supplying gas to said nozzles at predetermined timing, flow rate, and pressure.

16. A substrate body transfer apparatus in accordance with claim 15, in which the nozzles provided with the function of conducting floatation and grounding of said substrate body are bored at an angle of 22° with respect to the conveyance surface of said lower part valve, and the horizontal force component of the gas stream sprayed from said nozzles is such as to be divided into one of four quadrants or three quadrants pointing to the center of said lower part valve.

17. A substrate body transfer apparatus in accordance with claim 15, in which the nozzles provided with the function of conducting the catching and launch of said substrate body are bored at an angle of 22° with respect to the conveyance surface of said lower part valve, and the horizontal force component of the gas stream sprayed from these nozzles is arranged so as to be substantially parallel to the air conveyance path which communicates with the interior space of said air conveyance apparatus.

18. A substrate body transfer apparatus in accordance with claim 15, in which the nozzles provided with the function of conducting horizontal rotation or horizontal stoppage of said substrate body have the function of determining the direction of the axis of crystallization of said substrate body and placing said substrate body on a means for raising and lowering said substrate body provided at the conveyance surface of said lower part valve.

* * * * *